(12) United States Patent
Polasa et al.

(10) Patent No.: US 12,092,690 B2
(45) Date of Patent: Sep. 17, 2024

(54) EMULATION OF JTAG/SCAN TEST INTERFACE PROTOCOLS USING SPI COMMUNICATION DEVICE

(71) Applicant: SILICONCH SYSTEMS PVT LTD, Karnataka (IN)

(72) Inventors: Rakesh Kumar Polasa, Karnataka (IN); Alagesan Mani, Tamil Nadu (IN)

(73) Assignee: SILICONCH SYSTEMS PVT LTD, Karnataka (IN)

( * ) Notice: Subject to any disclaimer, the term of this patent is extended or adjusted under 35 U.S.C. 154(b) by 0 days.

(21) Appl. No.: 18/140,930

(22) Filed: Apr. 28, 2023

(65) Prior Publication Data
US 2024/0219464 A1    Jul. 4, 2024

(30) Foreign Application Priority Data
Dec. 31, 2022 (IN) .............................. 202241077541

(51) Int. Cl.
*G01R 31/3183* (2006.01)
*G01R 31/3185* (2006.01)

(52) U.S. Cl.
CPC ........... *G01R 31/318314* (2013.01); *G01R 31/318536* (2013.01); *G01R 31/318555* (2013.01)

(58) Field of Classification Search
CPC ........ G01R 31/318314; G01R 31/3185; G01R 31/318536; G01R 31/318555
(Continued)

(56) References Cited

U.S. PATENT DOCUMENTS

2006/0212679 A1* 9/2006 Alfano .................. G06F 13/385
712/38
2007/0061646 A1* 3/2007 Whetsel ........... G01R 31/31723
714/726
(Continued)

FOREIGN PATENT DOCUMENTS

CN    106569416 A  *  4/2017
CN    114089172 A  *  2/2022
(Continued)

OTHER PUBLICATIONS

Universal Serial Bus Type-C Cable and Connector Specification Release 2.0, USB 3.0 Promoter Group, Aug. 2019 (373 pages).
(Continued)

*Primary Examiner* — Albert Decady
*Assistant Examiner* — Osman M Alshack
(74) *Attorney, Agent, or Firm* — Procopio, Cory, Hargreaves & Savitch LLP

(57) ABSTRACT

The present disclosure relates to an apparatus (100) for joint test action group (JTAG) and scan emulation, the apparatus includes a controller circuitry (102) that is interfaced to a target integrated circuit (IC) (106) for testing the target IC, the controller circuitry having one or more serial peripheral interface (SPI) devices (104-1, 104-2) operating in master mode and slave mode. The controller circuitry (102) operates the one or more SPI devices (104-1, 104-2) to switch between a first mode and a second mode dynamically to emulate JTAG and scan test functionality. The controller circuitry facilitates reusing the one or more SPI devices located in the controller circuitry to emulate JTAG and scan test interface protocols without any additional hardware requirements.

10 Claims, 6 Drawing Sheets

(58) Field of Classification Search
USPC .......................................................... 714/724
See application file for complete search history.

(56) References Cited

U.S. PATENT DOCUMENTS

| | | | | |
|---|---|---|---|---|
| 2013/0085704 A1* | 4/2013 | Stanley | .......... | G01R 31/318572 |
| | | | | 702/118 |
| 2013/0346814 A1* | 12/2013 | Zadigian | ........ | G01R 31/318536 |
| | | | | 714/724 |
| 2024/0095366 A1* | 3/2024 | Ye | .......................... | G06F 21/575 |

FOREIGN PATENT DOCUMENTS

| | | | | |
|---|---|---|---|---|
| CN | 114528034 A | * | 5/2022 | |
| CN | 115524605 A | * | 12/2022 | |

OTHER PUBLICATIONS

Universal Serial Bus Power Delivery Specification, Revision 3.0, Version 2.0, Aug. 29, 2019 (657 pages).

* cited by examiner

EMULATION OF JTAG/SCAN TEST INTERFACE PROTOCOLS USING SPI COMMUNICATION DEVICE

CROSS REFERENCE TO RELATED APPLICATION(S)

This application claims the benefit of and priority to India Application Serial No. 202241077541, entitled "EMULATION OF JTAG/SCAN TEST INTERFACE PROTOCOLS USING SPI COMMUNICATION DEVICE" and filed on Dec. 31, 2022, which is expressly incorporated by reference herein in its entirety.

TECHNICAL FIELD

The present disclosure relates, in general, to an integrated circuit (IC) signal interface, and more specifically, relates to an emulation of JTAG/SCAN test interface protocols using a serial peripheral interface (SPI) communication device.

BACKGROUND

Electrical devices, which may be boards, integrated circuits (ICs) or embedded cores within ICs, require JTAG interfaces to provide testing and debugging of the device's hardware and software designs. Recently, device test and debug interfaces used the full-pin JTAG interface consisting of TDI, TCK, TMS, and TDO signal pins and the SCAN interface consisting of SDI, SCK, and SDO signal pins.

More recently, JTAG interfaces and SCAN interfaces are being used for test and debug operations. The JTAG/SCAN is done using a separate PHY layer. Therefore, the existing integrated circuit has several limitations that are as follows:
Require FPGA to emulate JTAG/SCAN
Require special IC for JTAG
High cost

SUMMARY

Therefore, it is desired to overcome the drawbacks, shortcomings, and limitations associated with existing solutions, and develop a cost-effective apparatus that reuse the SPI communication device available in the general-purpose microcontrollers to emulate JTAG/SCAN test interface protocols without any additional hardware requirements.

An object of the present disclosure relates, in general, to an integrated circuit (IC) signal interface, and more specifically, relates to an emulation of JTAG/SCAN test interface protocols using the SPI communication device.

Another object of the present disclosure is to provide an apparatus that reuses the SPI communication device available in the general-purpose microcontrollers to emulate JTAG/SCAN test interface protocols without any additional hardware requirements.

Another object of the present disclosure is to provide an apparatus that can be used for the IC test platforms for implementing JTAG/SCAN protocols with more flexibility for timing.

Yet another object of the present disclosure is to provide a cost-effective, and efficient apparatus.

The present disclosure relates in general, to an integrated circuit (IC) signal interface, and more specifically, relates to an emulation of JTAG/SCAN test interface protocols using the SPI communication device. The main objective of the present disclosure is to overcome the drawback, limitations, and shortcomings of the existing system and solution, by providing an apparatus that facilitates reusing one or more SPI devices located in the controller circuitry to emulate JTAG and scan test interface protocols without any additional hardware required.

The present disclosure relates to an apparatus for joint test action group (JTAG) and scan emulation, the apparatus includes a controller circuitry that is interfaced to a target integrated circuit (IC) for testing the target IC. The controller circuitry having one or more serial peripheral interface (SPI) devices operating in master mode and slave mode. The one or more SPI devices having a plurality of pins to perform JTAG and scan emulation, where the plurality of pins configured to emulate JTAG testing by using a clock (CLK) pin of the master SPI device to serve as a test clock (TCK) signal to the slave SPI device and the target IC, a master output slave input (MOSI) pin of the master SPI device is provided as a test data input (TDI) signal to the target IC, a master input slave output (MISO) pin of the slave SPI device is provided as a test mode select (TMS) signal for the target IC and a test data output (TDO) signal is received by the master input slave output (MISO) pin of the master SPI device from the target IC.

Further, the plurality of pins configured to emulate scan testing by using the CLK pin of the master SPI device to serve as a serial clock (SCK) signal to the slave SPI device and the target IC, the MOSI pin of the master SPI device and the MISO pin of the slave SPI device is provided as serial data input (SDI) signals to the target IC and receive, from the target IC, serial data output (SDO) signals by the MISO pin of the master SPI device and the MOSI pin of the slave SPI device. Accordingly, controller circuitry facilitates reusing one or more SPI devices located in the controller circuitry to emulate JTAG and scan test interface protocols without any additional hardware requirements.

In an aspect, the controller circuitry operates one or more SPI devices to switch between a first mode and a second mode dynamically to emulate JTAG and scan test functionality. The controller circuitry operates one or more SPI devices to emulate the JTAG testing in the first mode, in which one or more SPI devices can include a first SPI device that operates in the master mode and the second SPI device that operate in the slave mode. The controller circuitry is configured to connect a master chip select signal to slave chip select signal. The controller circuitry configured to generate, by the first SPI device operating in master mode, the TCK signal for communication, load the TDI data in the first SPI device operating in the master mode and load the TMS data in the second SPI device operating in the slave mode, wherein the data are transmitted in the TDI and TMS lines and store the TDO data received from the target IC in a shift register of the first SPI device operating in the master mode.

The controller circuitry operates one or more SPI devices to emulate the JTAG testing in the second mode, in which both the first SPI device and the second SPI device operate in the slave mode. The controller circuitry is configured to load the TMS data into the second SPI device operating in the slave mode, load the TDI data into the first SPI device operating in the slave mode, enable the slave select (NSS) pin of the first SPI device and the second SPI device operating in the slave mode, the NSS pin connected to a general-purpose input/output (GPIO) pin, enable the UART circuit to transmit the TCK signal for the first SPI device and the second SPI device operating in the slave mode and store the TDO data received from the target IC in the shift register of the first SPI device operating in the slave mode.

The controller circuitry operates the one or more SPI devices to emulate a single scan chain testing in the first mode, in which at least one SPI device operates in the master mode, the controller circuitry is configured to load the SDI data into the first SPI device operating in the master mode, generate, by the first SPI device operating in master mode, the SCK signal for communication, control scan reset by GPIO pin, enable the NSS pin of the first SPI device operating in the master mode and store the SDO data received from the target IC in the shift register of the first SPI device operating in the master mode.

In another aspect, the controller circuitry operates one or more SPI devices to emulate a single scan chain testing in the second mode, at least one SPI device operates in the slave mode, wherein the controller circuitry is configured to load the SDI data into the first SPI device operating in the slave mode, control scan reset and scan enable (SEN) by GPIO pin, enable the NSS pin of the first SPI device operating in the slave mode by GPIO pin, enable the UART circuit to transmit the SCK signal for the first SPI device operating in the slave mode and store the SDO data received from the target IC in the shift register of the first SPI device operating in the slave mode.

In another aspect, the controller circuitry operates the one or more SPI devices to emulate a dual scan chain testing in the first mode, in which the first SPI device operates in the master mode and the second SPI device operates in the slave mode, where the dual scan chain testing includes at least two SDI signals and at least two SDO signals to speed the testing of the target IC.

Accordingly, the controller circuitry operates one or more SPI devices to emulate the dual scan chain testing in the first mode, the controller circuitry is configured to connect the master chip select signal to the slave chip select signal which is on the NSS pin of the second SPI device operating in the slave mode, generate the SCK signal by the first SPI device operating in the master mode for communication, load the SDI0 data in the first SPI device operating in the master mode, load the SDI1 data in the second SPI device operating in the slave mode, control scan reset and scan enable (SEN) by the GPIO pin, enable the NSS pin of the second SPI device operating in the slave mode, and store SDO0 data and SDO1 data received from the target IC in the shift register of the first SPI device operating in the master mode and the second SPI device operating in the slave mode.

In another aspect, the controller circuitry operates one or more SPI devices to emulate the dual scan chain testing in the second mode, in which both the first SPI device and the second SPI device operate in the slave mode, wherein the controller circuitry configured to load the SDI0 into the first SPI device operating in the slave mode, load the SDI1 into the second SPI device operating in the slave mode, control scan reset and scan enable (SEN) by the GPIO pin, enable the NSS pin of the first SPI device and the second SPI device operating in the slave mode by the GPIO pin, enable the UART circuit to transmit the SCK signal for the first SPI device and the second SPI device operating in the slave mode and store SDO0 data and SDO1 data received from the target IC in the shift register of the first SPI device and the second SPI device operating in the slave mode.

Various objects, features, aspects, and advantages of the inventive subject matter will become more apparent from the following detailed description of preferred embodiments, along with the accompanying drawing figures in which like numerals represent like components.

BRIEF DESCRIPTION OF THE DRAWINGS

The following drawings form part of the present specification and are included to further illustrate aspects of the present disclosure. The disclosure may be better understood by reference to the drawings in combination with the detailed description of the specific embodiments presented herein.

DETAILED DESCRIPTION

Figure 1A:
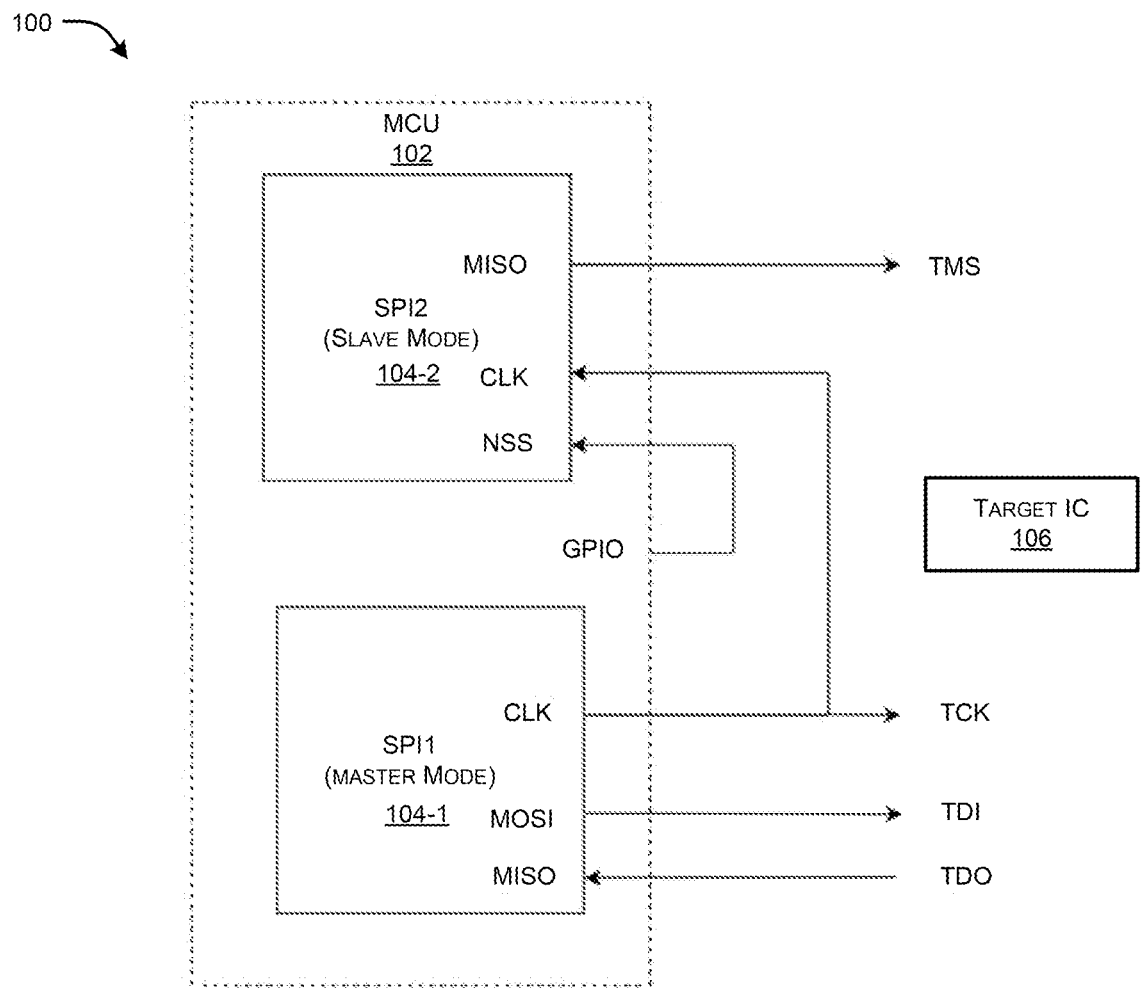
FIG. 1A illustrates an exemplary view of emulation of JTAG using SPI communication device in first mode, in accordance with an embodiment of the present disclosure.

The following is a detailed description of embodiments of the disclosure depicted in the accompanying drawings. The embodiments are in such detail as to clearly communicate the disclosure. If the specification states a component or feature "may", "can", "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The present disclosure relates, in general, to an integrated circuit (IC) signal interface, and more specifically, relates to an emulation of JTAG/SCAN test interface protocols using SPI communication device. The proposed apparatus disclosed in the present disclosure overcomes the drawbacks, shortcomings, and limitations associated with the conventional system by providing an apparatus that facilitates reusing one or more SPI devices located in the controller circuitry to emulate JTAG and scan test interface protocols without any additional hardware required.

The present disclosure relates to an apparatus for joint test action group (JTAG) and scan emulation, the apparatus includes a controller circuitry that is interfaced to a target integrated circuit (IC) for testing the target IC. The controller circuitry having one or more serial peripheral interface (SPI) devices operating in master mode and slave mode. The one or more SPI devices having a plurality of pins to perform JTAG and scan emulation, where the plurality of pins configured to emulate JTAG testing by using a clock (CLK) pin of the master SPI device to serve as a test clock (TCK) signal to the slave SPI device and the target IC, a master output slave input (MOSI) pin of the master SPI device is provided as a test data input (TDI) signal to the target IC, a master input slave output (MISO) pin of the slave SPI device is provided as a test mode select (TMS) signal for the target IC and receive, from the target IC, a test data output (TDO) signal by the master input slave output (MISO) pin of the master SPI device.

Further, the plurality of pins configured to emulate scan testing by using the CLK pin of the master SPI device to serve as a serial clock (SCK) signal to the slave SPI device and the target IC, the MOSI pin of the master SPI device and MISO pin of the slave SPI device is provided as serial data input (SDI) signals to the target IC and serial data output (SDO) signals are received by the MISO pin of the master SPI device and the MOSI pin of the slave SPI device from the target IC, wherein the controller circuitry facilitates reusing the one or more SPI devices located in the controller circuitry to emulate JTAG and scan test interface protocols without any additional hardware requirements.

In an aspect, the controller circuitry operates the one or more SPI devices to switch between a first mode and a second mode dynamically to emulate JTAG and scan test functionality. The controller circuitry operates the one or more SPI devices to emulate the JTAG testing in the first mode, in which the one or more SPI devices can include a first SPI device that operates in the master mode and the second SPI device operating in the slave mode. The controller circuitry is configured to connect a master chip select signal to the slave chip select signal. The slave NSS is controlled by GPIO. The controller circuitry configured to generate, by the first SPI device operating in master mode, the TCK signal for communication, load the TDI data in the first SPI device operating in the master mode and load the TMS data in the second SPI device operating in the slave mode, wherein the data are transmitted in the TDI and TMS lines and store the TDO data received from the target IC in a shift register of the first SPI device operating in the master mode.

The controller circuitry operates the one or more SPI devices to emulate the JTAG testing in the second mode, in which both the first SPI device and the second SPI device operate in the slave mode. The controller circuitry is configured to load the TMS data into the second SPI device operating in the slave mode, load the TDI data into the first SPI device operating in the slave mode, enable slave select (NSS) pin of the first SPI device and the second SPI device operating in the slave mode, the NSS pin connected to a general-purpose input/output (GPIO) pin, enable the UART circuit to transmit the TCK signal for the first SPI device and the second SPI device operating in the slave mode and store the TDO data received from the target IC in the shift register of the first SPI device operating in the slave mode.

The controller circuitry operates one or more SPI devices to emulate a single scan chain testing in the first mode, in which at least one SPI device operates in the master mode. The controller circuitry is configured to load the SDI data into the first SPI device operating in the master mode, generate, by the first SPI device operating in master mode, the SCK signal for communication, control scan reset by GPIO pin, enable the NSS pin of the first SPI device operating in the master mode and store the SDO data received from the target IC in the shift register of the first SPI device operating in the master mode.

In another aspect, the controller circuitry operates the one or more SPI devices to emulate a single scan chain testing in the second mode, at least one SPI device operates in the slave mode, where the controller circuitry is configured to load the SDI data into the first SPI device operating in the slave mode, control scan reset and scan enable (SEN) by GPIO pin, enable the NSS pin of the first SPI device operating in the slave mode by GPIO pin, enable the UART circuit to transmit the SCK signal for the first SPI device operating in the slave mode and store the SDO data received from the target IC in the shift register of the first SPI device operating in the slave mode.

In another aspect, the controller circuitry operates one or more SPI devices to emulate an dual scan chain testing in the first mode, in which the first SPI device operates in the master mode and the second SPI device operates in the slave mode, where the dual scan chain testing includes at least two SDI signals and at least two SDO signals to speed the testing of the target IC. The controller circuitry operates one or more SPI devices to emulate the dual scan chain testing in the first mode, the controller circuitry is configured to connect the master chip select signal to the slave chip select signal which is on the NSS pin of the second SPI device operating in the slave mode. The controller circuitry generates the SCK signal by the first SPI device operating in the master mode for communication, load the SDI0 data in the first SPI device operating in the master mode, load the SDI1 data in the second SPI device operating in the slave mode, control scan reset and scan enable (SEN) by the GPIO pin, enable the NSS pin of the second SPI device operating in the slave mode and store SDO0 data and SDO1 data received from the target IC in the shift register of the first SPI device operating in the master mode and the second SPI device operating in the slave mode.

In another aspect, the controller circuitry operates one or more SPI devices to emulate the dual scan chain testing in the second mode, in which both the first SPI device and the second SPI device operate in the slave mode. The controller circuitry configured to load the SDI0 into the first SPI device operating in the slave mode, load the SDI1 into the second SPI device operating in the slave mode, control scan reset and scan enable (SEN) by the GPIO pin, enable the NSS pin of the first SPI device and the second SPI device operating in the slave mode by the GPIO pin, enable the UART circuit to transmit the SCK signal for the first SPI device and the second SPI device operating in the slave mode and store SDO0 data and SDO1 data received from the target IC in the shift register of the first SPI device and the second SPI device operating in the slave mode. The present disclosure can be described in enabling detail in the following examples, which may represent more than one embodiment of the present disclosure.

The advantages achieved by the apparatus of the present disclosure can be clear from the embodiments provided herein. The apparatus reuses the SPI communication device available in the general-purpose microcontrollers to emulate JTAG/SCAN test interface protocols without any additional hardware requirements. The present invention provides the apparatus that can be used for the IC test platforms for implementing JTAG/SCAN protocols with more flexibility for timing. Further, the present invention provides a cost-effective, and efficient apparatus. The description of terms and features related to the present disclosure shall be clear from the embodiments that are illustrated and described; however, the invention is not limited to these embodiments only. Numerous modifications, changes, variations, substitutions, and equivalents of the embodiments are possible within the scope of the present disclosure. Additionally, the invention can include other embodiments that are within the scope of the claims but are not described in detail with respect to the following description.

FIG. 1A illustrates an exemplary view of emulation of JTAG using SPI communication device in the first mode, in accordance with an embodiment of the present disclosure.

Referring to FIG. 1A, apparatus 100 for joint test action group (JTAG) and scan emulation is disclosed. The apparatus 100 can include controller circuitry 102 and one or more SPI devices (104-1, 104-2). The controller circuitry 102 is interfaced to a target integrated circuit (IC) 106, the controller circuitry 102 having one or more SPI devices (104-1, 104-2) operating in master mode and slave mode. The one or more SPI devices (104-1, 104-2) exchange signals with the target IC 106. The signals that are exchanged between one or more SPI devices (104-1, 104-2) operating in master mode and slave mode include the test data in (TDI) signals, the test clock (TCK) signals, the test mode select (TMS) signals, and the test data out (TDO) signals.

In an embodiment, one or more SPI devices (104-1, 104-2) can include a first SPI device 104-1 and a second SPI device 104-2, where the first SPI device 104-1 operating in master mode and the second SPI device 104-2 is operating in slave mode shown in FIG. 1A. The first SPI device 104-1 operating in master mode can include multiple pins such as clock (CLK) pin, master out slave in (MOSI) pin, master in slave out (MISO) pin. The second SPI device 104-2 operating in slave mode can include multiple pins such as MISO pin, CLK Pin and NSS pin.

The one or more SPI devices (104-1, 104-2) can include multiples pins to perform JTAG emulation, the multiple pins configured to emulate JTAG testing by using a clock (CLK) pin of the master SPI device 104-1 to serve as a TCK signal to the slave SPI device 104-2 and the target IC 106. The MOSI pin of the master SPI device 104-1 is provided as TDI signal to the target IC 106. The MISO pin of the slave SPI device 104-2 is provided as TMS signal for the target IC. The TDO signal is received from the target IC 106 by the MISO pin of the master SPI device 104-1.

The controller circuitry 102 facilitates reusing one or more SPI devices (104-1, 104-2) located in the controller circuitry 102 to emulate JTAG and scan test interface protocols without any additional hardware requirements. The controller circuitry 102 operates one or more SPI devices (104-1, 104-2) to switch between a first mode and a second mode dynamically to emulate JTAG and scan test functionality.

The controller circuitry 102 operates one or more SPI devices (104-1, 104-2) to emulate the JTAG testing in the first mode, in which one or more SPI devices (104-1, 104-2) can include the first SPI device 104-1 that operates in the master mode and the second SPI device 104-2 operate in the slave mode. The controller circuitry 102 is configured to connect a master chip select signal to a slave chip select signal. The first SPI device 104-1 operating in master mode generates the TCK signal for communication. The controller circuitry 102 is configured to load the TDI data in the first SPI device 104-1 operating in the master mode. The controller circuitry 102 is configured to load the TMS data in the second SPI device 104-2 operating in the slave mode, where the data are transmitted in the TDI and TMS lines and store the TDO data received from the target IC 106 in a shift register of the first SPI device 104-1 operating in the master mode.

Figure 1B:
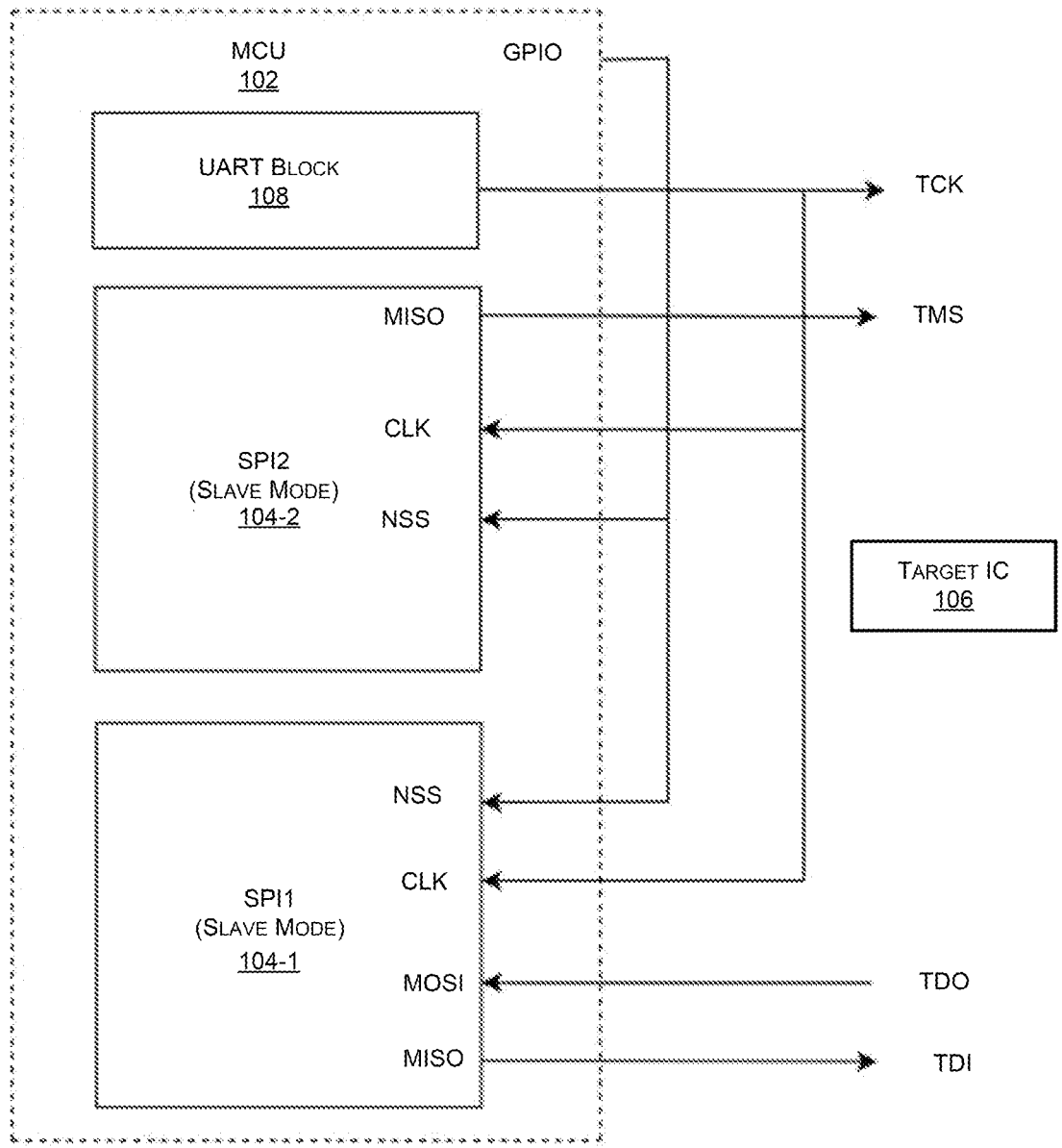
FIG. 1B illustrates an exemplary view of emulation of JTAG using SPI communication device in second mode, in accordance with an embodiment of the present disclosure.

FIG. 1B illustrates an exemplary view of emulation of JTAG using SPI communication device in the second mode, in accordance with an embodiment of the present disclosure.

The controller circuitry 102 operates one or more SPI devices (104-1, 104-2) to emulate the JTAG testing in the second mode, in which both the first SPI device 104-1 and the second SPI device 104-2 operate in the slave mode. The controller circuitry 102 is configured to load the TMS data into the second SPI device 104-2 operating in the slave mode. The controller circuitry 102 loads the TDI data into the first SPI device 104-1 operating in the slave mode. The controller circuitry 102 enables the slave select (NSS) pin of the first SPI device 104-1 and the second SPI device 104-2 to operate in the slave mode, where the NSS pin connected to a general-purpose input/output (GPIO) pin.

The controller circuitry 102 enable the UART circuit 108 to transmit the TCK signal for the first SPI device 104-1 and the second SPI device 104-2 operating in the slave mode and store the TDO data received from the target IC 106 in the shift register of the first SPI device 104-1 operating in the slave mode.

Figure 2A:
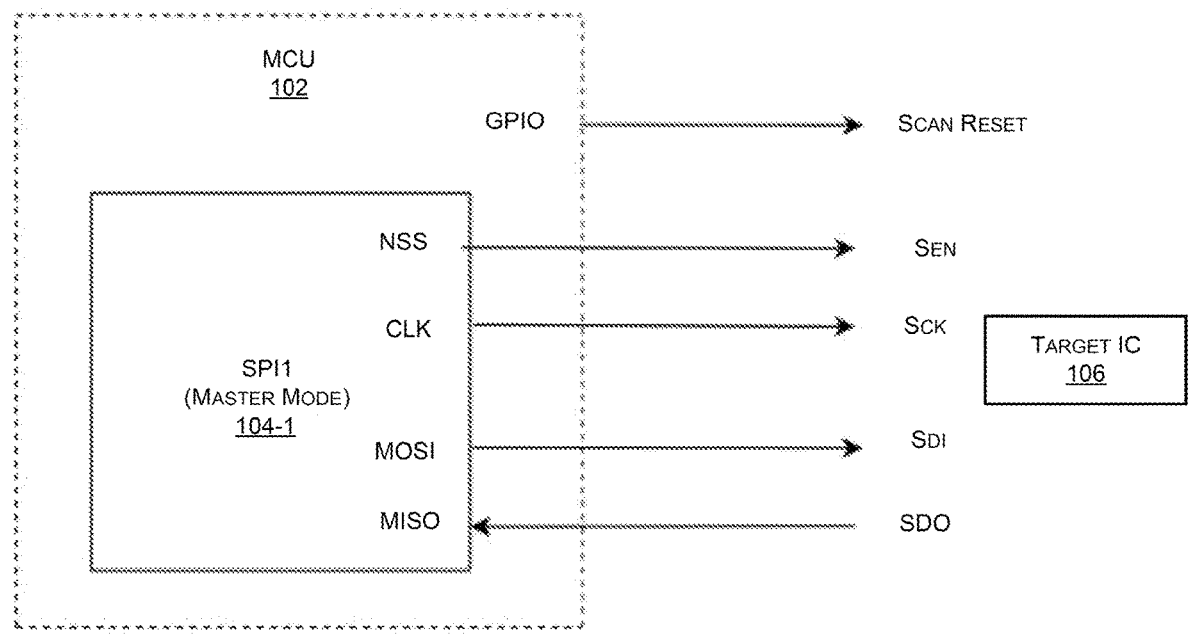
FIG. 2A illustrates an exemplary view of emulation of single scan chain using SPI communication device in first mode, in accordance with an embodiment of the present disclosure.

FIG. 2A illustrates an exemplary view of the emulation of a single scan chain using the SPI communication device in the first mode, in accordance with an embodiment of the present disclosure. Referring to FIG. 2A, the controller circuitry 102 operates one or more SPI devices (104-1, 104-2) to emulate a single scan chain testing in the first mode, in which at least one SPI device 104-1 operates in the master mode.

The controller circuitry 102 is configured to load the SDI data into the first SPI device 104-1 operating in the master mode. The controller circuitry 102 is configured to generate by the first SPI device 104-1 operating in master mode, the SCK signal for communication, and control scan reset by GPIO pin. The controller circuitry 102 enables the NSS pin of the first SPI device 104-1 operating in the master mode and store the SDO data received from the target IC 106 in the shift register of the first SPI device 104-1 operating in the master mode.

Figure 2B:
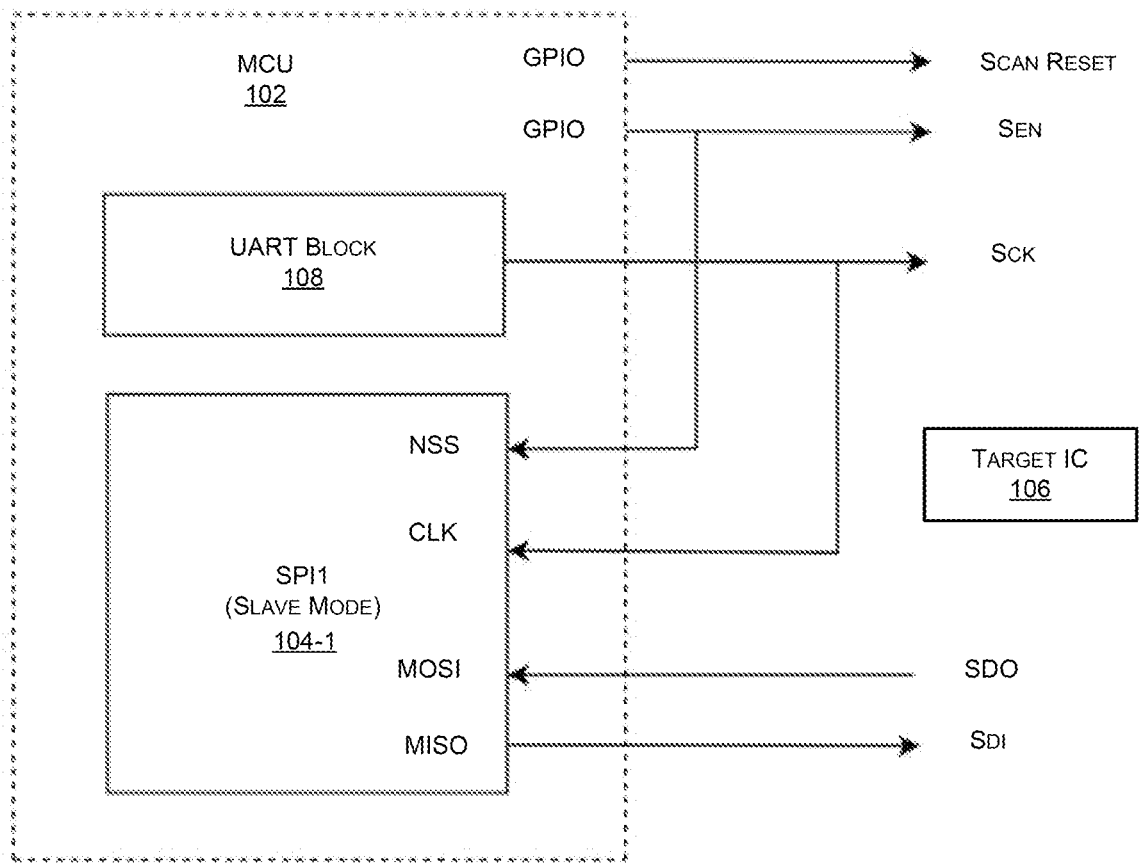
FIG. 2B illustrates an exemplary view of emulation of single scan chain using SPI communication device in second mode, in accordance with an embodiment of the present disclosure.

FIG. 2B illustrates an exemplary view of emulation of a single scan chain using SPI communication device in the second mode, in accordance with an embodiment of the present disclosure.

Referring to FIG. 2B, the controller circuitry 102 operates one or more SPI devices (104-1, 104-2) to emulate a single scan chain testing in the second mode, at least one SPI device 104-1 operates in the slave mode. The controller circuitry 102 is configured to load the SDI data into the first SPI device 104-1 operating in the slave mode. The controller circuitry 102 is configured to control scan reset and scan enable (SEN) by the GPIO pin. The controller circuitry 102 enable the NSS pin of the first SPI device 104-1 operating in the slave mode by the GPIO pin. The controller circuitry 102 enables the UART circuit 108 to transmit the SCK signal for the first SPI device 104-1 operating in the slave mode and store the SDO data received from the target IC in the shift register of the first SPI device 104-1 operating in the slave mode.

Figure 2C:
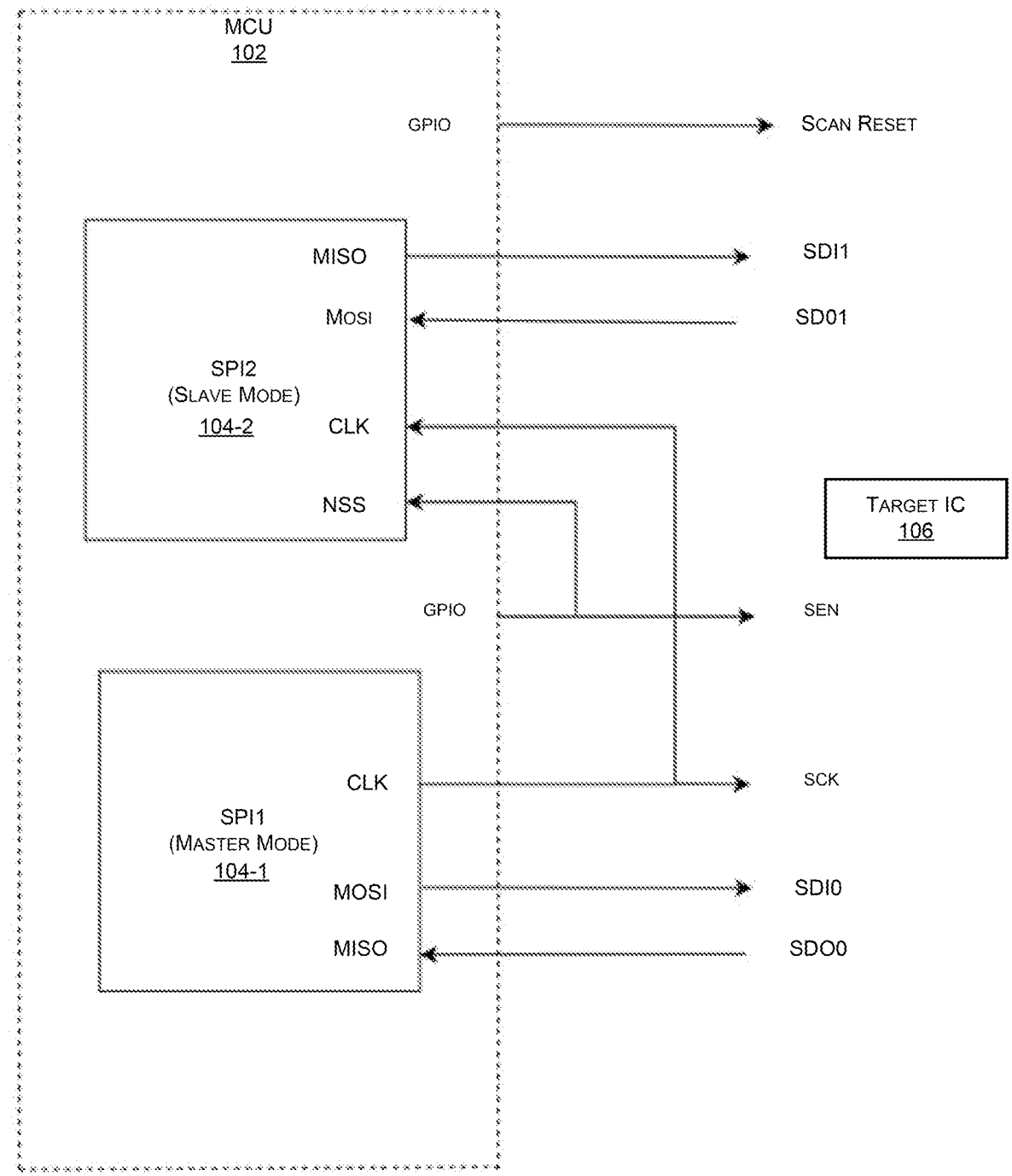
FIG. 2C illustrates an exemplary view of emulation of dual SCAN chain using SPI communication device in first mode, in accordance with an embodiment of the present disclosure.

FIG. 2C illustrates an exemplary view of emulation of dual SCAN chain using SPI communication device in first mode, in accordance with an embodiment of the present disclosure.

The controller circuitry 102 emulates a dual scan chain testing (also referred to as dual scan chain testing) in the first mode, in which the first SPI device 104-1 operating in the master mode and the second SPI device 104-2 operating in the slave mode. The dual scan chain testing includes at least two SDI signals to provide to the target IC and at least two SDO signals received from the target IC to speed the testing of the target ICs. The dual scan chain testing includes at least two SDI signals and at least two SDO signals to speed up the testing of the target IC.

The controller circuitry 102 operates one or more SPI devices (104-1, 104-2) to emulate the dual scan chain testing in the first mode, the controller circuitry 102 is configured to connect the master chip select signal to the slave chip select signal which is on the NSS pin of the second SPI device 104-2 operating in the slave mode.

The controller circuitry 102 can generate the SCK signal by the first SPI device operating in the master mode for communication. The controller circuitry 102 can load the SDI0 data in the first SPI device 104-1 operating in the master mode. The controller circuitry 102 can load the SDI1 data in the second SPI device 104-2 operating in the slave mode. The controller circuitry 102 control scan reset and scan enable (SEN) by the GPIO pin. The controller circuitry 102 enables the NSS pin of the second SPI device 104-2 operating in the slave mode and store SDO0 data and SDO1 data received from the target IC 106 in the shift register of the first SPI device 104-1 operating in the master mode and the second SPI device 104-2 operating in the slave mode.

Figure 2D:
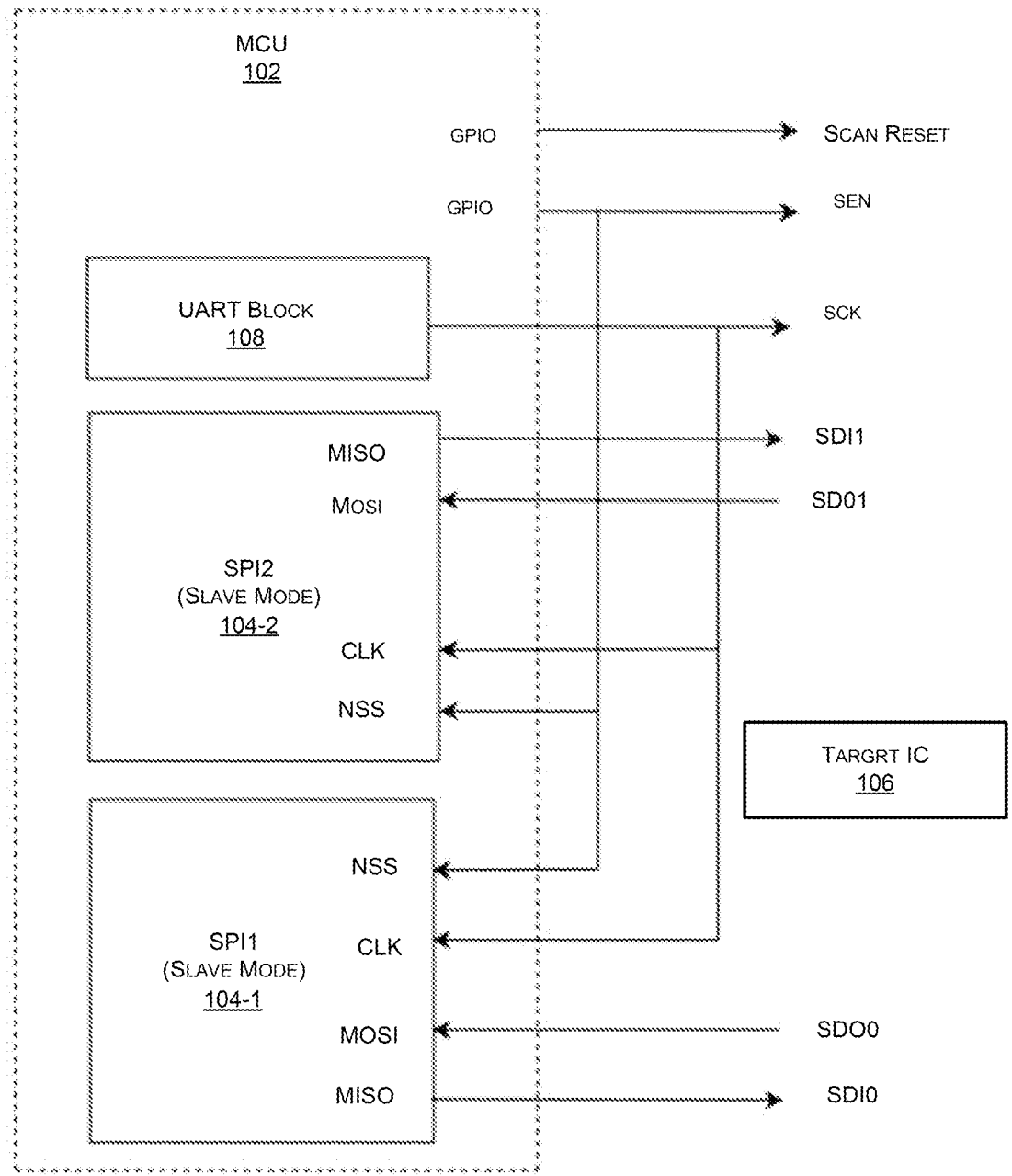
FIG. 2D illustrates an exemplary view of emulation of dual SCAN chain using SPI communication device in second mode, in accordance with an embodiment of the present disclosure.

FIG. 2D illustrates an exemplary view of emulation of dual SCAN chain using SPI communication device in the second mode, in accordance with an embodiment of the present disclosure.

The controller circuitry 102 operates one or more SPI devices (104-1, 104-2) to emulate a dual scan chain testing in the second mode, in which both the first SPI device 104-1 and the second SPI device 104-2 operate in slave mode.

The controller circuitry 102 is configured to load the SDI0 into the first SPI device 104-1 operating in the slave mode. The controller circuitry 102 can load the SDI1 into the second SPI device 104-2 operating in the slave mode. The controller circuitry 102 can control scan reset and scan enable (SEN) by the GPIO pin. The controller circuitry 102 can enable the NSS pin of the first SPI device 104-1 and the second SPI device 104-2 operating in the slave mode by the GPIO pin. The controller circuitry 102 enables the UART circuit 108 to transmit the SCK signal for the first SPI device 104-1 and the second SPI device 104-2 operating in the slave mode and store SDO0 data and SDO1 data received from the target IC 106 in the shift register of the first SPI device 104-1 and the second SPI device 104-2 operating in the slave mode.

Thus, the present invention overcomes the drawbacks, shortcomings, and limitations associated with existing solutions, and provides a cost-effective apparatus that reuse the SPI communication device available in the general-purpose microcontrollers to emulate JTAG/SCAN test interface protocols without any additional hardware requirements. This scheme can be used for the IC test platforms for implementing JTAG/SCAN protocols with more flexibility for timing.

It will be apparent to those skilled in the art that the apparatus 100 of the disclosure may be provided using some or all of the mentioned features and components without departing from the scope of the present disclosure. While various embodiments of the present disclosure have been illustrated and described herein, it will be clear that the disclosure is not limited to these embodiments only. Numerous modifications, changes, variations, substitutions, and equivalents will be apparent to those skilled in the art, without departing from the spirit and scope of the disclosure, as described in the claims.

The example implementations described herein provide an apparatus that reuses the SPI communication device available in the general-purpose microcontrollers to emulate JTAG/SCAN test interface protocols without any additional hardware requirements.

The example implementations described herein provide an apparatus that can be used for the IC test platforms for implementing JTAG/SCAN protocols with more flexibility for timing.

The example implementations described herein provide a cost-effective, and efficient apparatus.

We claim:

1. An apparatus for joint test action group (JTAG) and scan emulation, the apparatus comprising:
a controller circuitry that is interfaced to a target integrated circuit (IC) for testing the target IC, the controller circuitry having one or more serial peripheral interface (SPI) devices operating in master mode and slave mode, the one or more SPI devices having a plurality of pins to perform JTAG and scan emulation, the plurality of pins configured to:
emulate JTAG testing by using a clock (CLK) pin of a master SPI device to serve as a test clock (TCK) signal to a slave SPI device and the target IC;
provide a master output slave input (MOSI) pin of the master SPI device as a test data input (TDI) signal to the target IC;
provide a master input slave output (MISO) pin of the slave SPI device as a test mode select (TMS) signal for the target IC;
receive, from the target IC, a test data output (TDO) signal by the master input slave output (MISO) pin of the master SPI device; and
emulate scan testing by using the CLK pin of the master SPI device to serve as a serial clock (SCK) signal to the slave SPI device and the target IC;
provide the MOSI pin of the master SPI device and MISO pin of the slave SPI device as serial data input (SDI) signals to the target IC; and
receive, from the target IC, serial data output (SDO) signals by the MISO pin of the master SPI device and the MOSI pin of the slave SPI device, wherein the controller circuitry facilitates reusing the one or more SPI devices located in the controller circuitry to emulate JTAG and scan test interface protocols without any additional hardware requirements.

2. The apparatus as claimed in claim 1, wherein the controller circuitry operates the one or more SPI devices to switch between a first mode and a second mode dynamically to emulate JTAG and scan test functionality, wherein extended multiple scan chain is possible with dual/quad SPI devices or multiple SPI devices.

3. The apparatus as claimed in claim 1, wherein the controller circuitry operates the one or more SPI devices to emulate the JTAG testing in a first mode, in which the one or more SPI devices comprise a first SPI device that operates in the master mode and a second SPI device operate in the slave mode.

4. The apparatus as claimed in claim 3, wherein the controller circuitry is configured to:
connect a master chip select signal to slave chip select signal;
generate, by the first SPI device operating in the master mode, the TCK signal for communication;
load the TDI data in the first SPI device operating in the master mode;
load the TMS data in the second SPI device operating in the slave mode, wherein the data are transmitted in TDI and TMS lines; and
store the TDO data received from the target IC in a shift register of the first SPI device operating in the master mode.

5. The apparatus as claimed in claim 3, wherein the controller circuitry operates the one or more SPI devices to emulate the JTAG testing in the second mode, in which both the first SPI device and the second SPI device operate in the slave mode, wherein the controller circuitry is configured to:
- load the TMS data into the second SPI device operating in the slave mode;
- load the TDI data into the first SPI device operating in the slave mode;
- enable slave select (NSS) pin of the first SPI device and the second SPI device operating in the slave mode, the NSS pin connected to a general-purpose input/output (GPIO) pin;
- enable an Universal Asynchronous Receiver Transmitter (UART) circuit to transmit the TCK signal for the first SPI device and the second SPI device operating in the slave mode; and
- store the TDO data received from the target IC in a shift register of the first SPI device operating in the slave mode.

6. The apparatus as claimed in claim 3, wherein the controller circuitry operates the one or more SPI devices to emulate a single scan chain testing in the first mode, in which at least one SPI device operates in the master mode, the controller circuitry is configured to:
- load the SDI data into the first SPI device operating in the master mode;
- generate, by the first SPI device operating in master mode, the SCK signal for communication;
- control scan reset by a GPIO pin;
- enable a NSS pin of the first SPI device operating in the master mode; and
- store the SDO data received from the target IC in a shift register of the first SPI device operating in the master mode.

7. The apparatus as claimed in claim 3, wherein the controller circuitry operates the one or more SPI devices to emulate a single scan chain testing in the second mode, at least one SPI device operates in the slave mode, wherein the controller circuitry is configured to:
- load the SDI data into the first SPI device operating in the slave mode;
- control scan reset and scan enable (SEN) by a GPIO pin;
- enable a NSS pin of the first SPI device operating in the slave mode by the GPIO pin;
- enable a UART circuit to transmit the SCK signal for the first SPI device operating in the slave mode; and
- store the SDO data received from the target IC in a shift register of the first SPI device operating in the slave mode.

8. The apparatus as claimed in claim 3, wherein the controller circuitry operates the one or more SPI devices to emulate a dual scan chain testing in the first mode, in which the first SPI device operating in the master mode and the second SPI device operating in the slave mode, wherein the dual scan chain testing includes at least two SDI signals and at least two SDO signals to speed the testing of the target IC.

9. The apparatus as claimed in claim 3, wherein the controller circuitry operates the one or more SPI devices to emulate a dual scan chain testing in the first mode, the controller circuitry is configured to:
- connect master chip select signal to slave chip select signal which is on a NSS pin of the second SPI device operating in the slave mode;
- generate the SCK signal by the first SPI device operating in the master mode for communication;
- load SDI0 data in the first SPI device operating in the master mode;
- load SDI1 data in the second SPI device operating in the slave mode;
- control scan reset and scan enable (SEN) by a GPIO pin;
- enable the NSS pin of the second SPI device operating in the slave mode; and
- store SDO0 data and SDO1 data received from the target IC in a shift register of the first SPI device operating in the master mode and the second SPI device operating in the slave mode.

10. The apparatus as claimed in claim 3, wherein the controller circuitry operates the one or more SPI devices to emulate dual scan chain testing in the second mode, in which both the first SPI device and the second SPI device operate in the slave mode, wherein the controller circuitry configured to:
- load SDI0 into the first SPI device operating in the slave mode;
- load SDI1 into the second SPI device operating in the slave mode;
- control scan reset and scan enable (SEN) by a GPIO pin;
- enable a NSS pin of the first SPI device and the second SPI device operating in the slave mode by the GPIO pin;
- enable a UART circuit to transmit the SCK signal for the first SPI device and the second SPI device operating in the slave mode; and
- store SDO0 data and SDO1 data received from the target IC in a shift register of the first SPI device and the second SPI device operating in the slave mode.

* * * * *